United States Patent
Yasuda (10) Patent No.: US 9,680,446 B2
(45) Date of Patent: Jun. 13, 2017

(54) DEMULTIPLEXING APPARATUS WITH HEAT TRANSFER VIA ELECTRODES

(71) Applicant: Murata Manufacturing Co., Ltd., Nagaokakyo-shi, Kyoto-fu (JP)

(72) Inventor: Junpei Yasuda, Nagaokakyo-shi (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 21 days.

(21) Appl. No.: 15/002,522

(22) Filed: Jan. 21, 2016

(65) Prior Publication Data

US 2016/0142040 A1   May 19, 2016

Related U.S. Application Data

(63) Continuation of application No. PCT/JP2014/069902, filed on Jul. 29, 2014.

(30) Foreign Application Priority Data

Aug. 2, 2013 (JP) .................. 2013-161347

(51) Int. Cl.
*H03H 9/72* (2006.01)
*H03H 9/08* (2006.01)
(Continued)

(52) U.S. Cl.
CPC ...... *H03H 9/0576* (2013.01); *H03H 9/02834* (2013.01); *H03H 9/08* (2013.01);
(Continued)

(58) Field of Classification Search
CPC ......... H03H 9/0009; H03H 2009/0019; H03H 9/0028; H03H 9/02818; H03H 9/02834;
(Continued)

(56) References Cited

U.S. PATENT DOCUMENTS

2002/0000895 A1* 1/2002 Takahashi ............ H03H 9/0576
                                                                   333/133
2005/0264375 A1   12/2005 Ikuta et al.
(Continued)

FOREIGN PATENT DOCUMENTS

JP   2001-332654 A   11/2001
JP   2002-261449 A   9/2002
(Continued)

OTHER PUBLICATIONS

Official Communication issued in International Patent Application No. PCT/JP2014/069902, mailed on Oct. 14, 2014.
Official Communication issued in corresponding Korean Patent Application No. 10-2016-7002981, mailed on Dec. 19, 2016.

*Primary Examiner* — Barbara Summons
(74) *Attorney, Agent, or Firm* — Keating & Bennett, LLP (57) ABSTRACT

An elastic wave filter includes a transmission circuit provided on a first main surface of a first piezoelectric substrate and a reception circuit provided on a second main surface of a second piezoelectric substrate. A mounting board on which the elastic wave filter is mounted includes a first ground electrode opposed to the transmission circuit; a first rear surface ground electrode overlapped with the transmission circuit in plan view of a rear surface; a second ground electrode opposed to the reception circuit; a second rear surface ground electrode overlapped with the reception circuit in plan view of the rear surface; a line electrode used for connection between the first ground electrode and the second ground electrode; and a first via electrode and a second via electrode passing through the mounting board. An amount of heat transfer per unit time of the second via electrode is greater than an amount of heat transfer per unit time of the first via electrode.

17 Claims, 9 Drawing Sheets

(51) Int. Cl.
*H03H 9/64* (2006.01)
*H03H 9/05* (2006.01)
*H03H 9/02* (2006.01)
*H03H 9/10* (2006.01)
*H03H 9/54* (2006.01)
*H03H 9/70* (2006.01)
*H03H 9/00* (2006.01)

(52) U.S. Cl.
CPC .......... *H03H 9/1085* (2013.01); *H03H 9/542* (2013.01); *H03H 9/6433* (2013.01); *H03H 9/6483* (2013.01); *H03H 9/725* (2013.01); *H03H 9/0009* (2013.01); *H03H 9/02818* (2013.01); *H03H 9/64* (2013.01); *H03H 9/706* (2013.01)

(58) Field of Classification Search
CPC ...... H03H 9/0566; H03H 9/0576; H03H 9/08; H03H 9/1085; H03H 9/542; H03H 9/64; H03H 9/6433; H03H 9/6483; H03H 9/706; H03H 9/725
USPC .......................................... 333/133, 193, 195
See application file for complete search history.

(56) References Cited

U.S. PATENT DOCUMENTS

| | | | |
|---|---|---|---|
| 2005/0285700 A1* | 12/2005 | Koga | H03H 9/0576 333/133 |
| 2008/0212283 A1* | 9/2008 | Chernyakov | H01L 23/3677 361/709 |
| 2010/0060372 A1 | 3/2010 | Funahashi et al. | |
| 2011/0095843 A1 | 4/2011 | Murase et al. | |
| 2012/0086524 A1 | 4/2012 | Komura | |
| 2013/0335171 A1* | 12/2013 | Yamato | H03H 9/059 333/193 |

FOREIGN PATENT DOCUMENTS

| | | |
|---|---|---|
| JP | 2006-014296 A | 1/2006 |
| JP | 2006-304145 A | 11/2006 |
| JP | 2012-085112 A | 4/2012 |
| KR | 10-2005-0031230 A | 4/2005 |
| KR | 10-2010-0007911 A | 1/2010 |
| KR | 10-2011-0046284 A | 5/2011 |
| WO | 2012/114593 A1 | 8/2012 |
| WO | 2013/011649 A1 | 1/2013 |

* cited by examiner

DEMULTIPLEXING APPARATUS WITH HEAT TRANSFER VIA ELECTRODES

BACKGROUND OF THE INVENTION

1. Field of the Invention

The present invention relates to demultiplexing apparatuses. In particular, the present invention relates to a demultiplexing apparatus that includes an elastic wave filter including a transmission circuit and a reception circuit.

2. Description of the Related Art

Known surface acoustic wave demultiplexers, such as duplexers, use surface acoustic waves and simultaneously filter transmission signals and reception signals having different frequencies in the respective frequency bands to prevent the signals from entering from transmission circuits to reception circuits. Various surface acoustic wave filter apparatuses mounted in high-frequency circuits, such as cellular phones, have been proposed. Such a surface acoustic wave filter apparatus is proposed in, for example, Japanese Unexamined Patent Application Publication No. 2012-85112.

The areas of heat dissipation electrodes in demultiplexing apparatuses are being decreased with the decreasing size of the demultiplexing apparatuses in response to requests from the market. Accordingly, the demultiplexing apparatuses are desired to have high heat dissipation performance in order to suppress variation in characteristics of the apparatuses due to heat generation.

SUMMARY OF THE INVENTION

Preferred embodiments of the present invention provide a demultiplexing apparatus having improved heat dissipation performance.

A preferred embodiment of the present invention provides a demultiplexing apparatus including an elastic wave filter and a mounting board on which the elastic wave filter is mounted and which has a multilayer structure. The elastic wave filter includes a first piezoelectric substrate including a first main surface; a ladder type transmission circuit that is provided on the first main surface and that includes a series-arm elastic wave resonator and a parallel-arm elastic wave resonator; a second piezoelectric substrate including a second main surface; and a longitudinally coupled resonator-type reception circuit provided on the second main surface. The mounting board includes a third main surface; a rear surface opposite to the third main surface; a first ground electrode on the third main surface, which is provided at a position overlapped with the transmission circuit in plan view of the third main surface; a first rear surface ground electrode on the rear surface, which is provided at a position overlapped with the transmission circuit in plan view of the rear surface; a second ground electrode on the third main surface, which is provided at a position overlapped with the reception circuit in plan view of the third main surface; a second rear surface ground electrode on the rear surface, which is provided at a position overlapped with the reception circuit in plan view of the rear surface; a line electrode that is provided on the third main surface and that is used for connection between the first ground electrode and the second ground electrode; a first via electrode that is provided in the mounting board and that is used for connection between the first ground electrode and the first rear surface ground electrode; and a second via electrode that is provided in the mounting board and that is used for connection between the second ground electrode and the second rear surface ground electrode. The amount of heat transfer per unit time of the second via electrode is greater than the amount of heat transfer per unit time of the first via electrode.

In the demultiplexing apparatus, the line electrode is preferably provided at a position opposed to the transmission circuit.

In the demultiplexing apparatus, the projection area of the second via electrode on the third main surface is preferably greater than the projection area of the first via electrode on the third main surface. The quantity of the second via electrode is preferably greater than the quantity of the first via electrode.

In the demultiplexing apparatus, the same piezoelectric substrate is preferably used as the first piezoelectric substrate and the second piezoelectric substrate.

In the demultiplexing apparatus, it is preferred that the transmission circuit conform to a first communication standard, that the elastic wave filter further include a second transmission circuit conforming to a second communication standard different from the first communication standard, and that the mounting board further include a third ground electrode on the third main surface, which is provided at a position opposed to the second transmission circuit, and a second line electrode that is provided on the third main surface and that is used for connection between the third ground electrode and the second ground electrode.

In the demultiplexing apparatus, it is preferred that the first via electrode include a plurality of first electrode portions passing through at least portion of the mounting board, that the second via electrode include a plurality of second electrode portions passing through at least portion of the mounting board, and that a minimum width of the line electrode in plan view of the third main surface be greater than a maximum diameter of an inscribed circle when the first electrode portions are projected on the third main surface and be greater than a maximum diameter of an inscribed circle when the second electrode portions are projected on the third main surface.

The demultiplexing apparatus preferably further includes a sealing member provided on the third main surface so that the elastic wave filter is covered with the sealing member.

In the demultiplexing apparatus, the mounting board is preferably a laminated substrate including an electrode layer and a plurality of dielectric layers alternatingly provided, and the second via electrode preferably includes a plurality of second electrode portions passing through all the plurality of dielectric layers.

According to various preferred embodiments of the present invention, it is possible to provide demultiplexing apparatuses having improved heat dissipation performance.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be herein described, taking demultiplexing apparatuses each provided with a duplexer as examples. The duplexer is one kind of a surface acoustic wave filter. However, the duplexer is only an example. The demultiplexing apparatuses according to various preferred embodiments of the present invention are not limited to the apparatuses provided with the duplexers. The present invention is also applicable to demultiplexing apparatuses provided with surface acoustic wave filters, such as triplexers, other than the duplexers.

The same reference numerals may be used in the preferred embodiments described below to identify the same or equivalent components and a description of such components may not be repeated. In addition, when number or quantity is mentioned, the scope of the present invention is not limited to the number or quantity unless otherwise specified. Furthermore, each component in the preferred embodiments described below is not necessarily essential for the present invention unless otherwise specified.

First Preferred Embodiment

Figure 1:
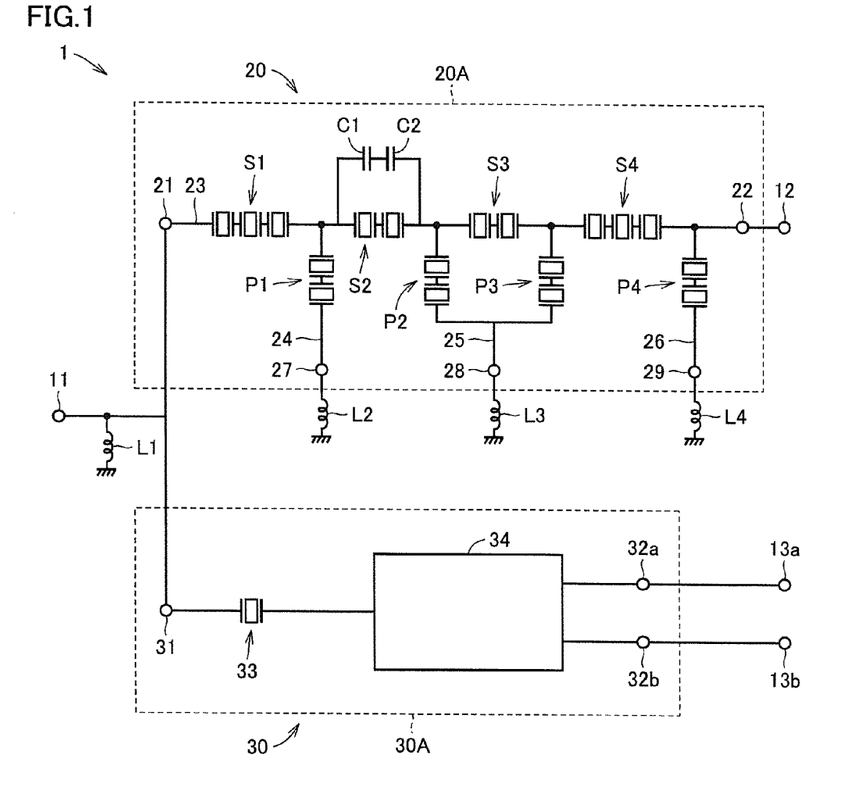
FIG. 1 is a schematic circuit diagram of a duplexer defining a demultiplexing apparatus according to a first preferred embodiment of the present invention.

FIG. 1 is a schematic circuit diagram of a duplexer 1 defining a demultiplexing apparatus according to a first preferred embodiment of the present invention. As illustrated in FIG. 1, the duplexer 1, which is an example of an elastic wave filter, is provided with an antenna terminal 11 connected to an antenna, a transmission-side signal terminal 12, and first and second reception-side signal terminals 13a and 13b. A transmission circuit 20 is connected between the antenna terminal 11 and the transmission-side signal terminal 12. A reception circuit 30 is connected between the antenna terminal 11 and the first and second reception-side signal terminals 13a and 13b.

A matching circuit including an inductor L1 is connected between the antenna terminal 11, and the transmission circuit 20 and the reception circuit 30. One end of the inductor L1 is connected to the antenna terminal 11 and the other end thereof is connected to ground potential.

The transmission circuit 20 includes a ladder type surface acoustic wave filter. The transmission circuit 20 includes an output terminal 21 and an input terminal 22. The output terminal 21 is connected to the antenna terminal 11 and the input terminal 22 is connected to the transmission-side signal terminal 12.

The transmission circuit 20 includes a series arm 23 connecting the output terminal 21 to the input terminal 22. In the series arm 23, series-arm elastic wave resonators S1 to S4 are connected in series to each other. Capacitors C1 and C2 are connected in parallel to the series-arm elastic wave resonator S2.

The transmission circuit 20 includes parallel arms 24 to 26 connected between the series arm 23 and the ground potential. A parallel-arm elastic wave resonator P1 and an inductor L2 are provided in series in the parallel arm 24. The parallel-arm elastic wave resonator P1 is electrically connected to a terminal 27. One end of the inductor L2 is connected to the terminal 27 and the other end thereof is connected to the ground potential.

Parallel-arm elastic wave resonators P2 and P3 and an inductor L3 are provided in the parallel arm 25. The parallel-arm elastic wave resonators P2 and P3 are electrically connected to a terminal 28. One end of the inductor L3 is connected to the terminal 28 and the other end thereof is connected to the ground potential. A parallel-arm elastic wave resonator P4 and an inductor L4 are provided in the parallel arm 26. The parallel-arm elastic wave resonator P4 is electrically connected to a terminal 29. One end of the inductor L4 is connected to the terminal 29 and the other end thereof is connected to the ground potential.

Each of the series-arm elastic wave resonators S1 to S4 and the parallel-arm elastic wave resonators P1 to P4 includes a surface acoustic wave resonator. Each of the inductors L1 to L4 is an inductance caused by a wiring pattern.

The reception circuit 30 includes a longitudinally coupled resonator-type surface acoustic wave filter. The reception circuit 30 includes an unbalanced input terminal 31 and first and second balanced output terminals 32a and 32b. The unbalanced input terminal 31 is connected to the antenna terminal 11, the first balanced output terminal 32a is connected to the first reception-side signal terminal 13a, and the second balanced output terminal 32b is connected to the second reception-side signal terminal 13b.

The reception circuit 30 includes a surface acoustic wave resonator 33 and a longitudinally coupled resonator-type surface acoustic wave filter unit 34. The surface acoustic wave resonator 33 and the longitudinally coupled resonator-type surface acoustic wave filter unit 34 are connected between the unbalanced input terminal 31 and the first and second balanced output terminals 32a and 32b. The longitudinally coupled resonator-type surface acoustic wave filter unit 34 is a filter unit having a balanced-unbalanced transforming function. The reception circuit may be an unbalanced-unbalanced longitudinally coupled resonator-type surface acoustic wave filter unit.

Figure 2:
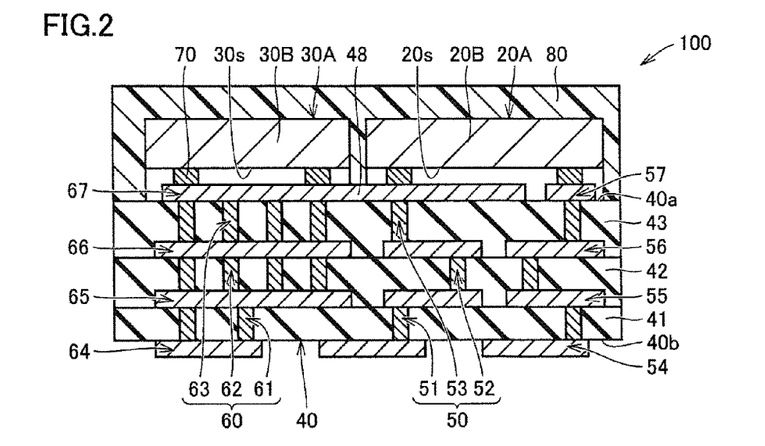
FIG. 2 is a schematic cross-sectional view of the demultiplexing apparatus of the first preferred embodiment of the present invention.

FIG. 2 is a schematic cross-sectional view of a demultiplexing apparatus 100 of the first preferred embodiment. The demultiplexing apparatus 100 of the present preferred embodiment includes a transmission-side surface acoustic wave filter chip 20A and a reception-side surface acoustic wave filter chip 30A, which define the duplexer 1, and a mounting board 40 on which the duplexer 1 is mounted. A portion of the transmission circuit 20 is provided on the transmission-side surface acoustic wave filter chip 20A. A portion of the reception circuit 30 is provided on the reception-side surface acoustic wave filter chip 30A. The mounting board 40 includes a die-attach surface 40a, which is one main surface, and a rear surface 40b, which is the other main surface opposite to the die-attach surface 40a.

The transmission-side surface acoustic wave filter chip 20A and the reception-side surface acoustic wave filter chip 30A are flip-chip mounted on the die-attach surface 40a of the mounting board 40 with bumps 70 disposed therebetween. A resin sealing member 80 is provided on the die-attach surface 40a of the mounting board 40 so that the transmission-side surface acoustic wave filter chip 20A and the reception-side surface acoustic wave filter chip 30A are covered with the sealing member 80 with a hollow space. In other words, the duplexer 1 of the present preferred embodiment is a chip size package (CSP) type surface acoustic wave filter apparatus.

As illustrated in FIG. 2, the mounting board 40 has a multilayer structure in which first to third dielectric layers 41 to 43 and first to fourth electrode layers 54 to 57 and 64 to are sequentially laminated. The mounting board 40 is a laminated substrate formed by alternately laminating the electrode layers and the dielectric layers. An example in which the mounting board includes a laminated body including the three dielectric layers and the four electrode layers is described in the present preferred embodiment. However, the present invention is not limited to this structure. In the present invention, the mounting board may be a single-layer dielectric body or may include two or more dielectric layers. The dielectric layers each define and function as an insulating layer that performs insulation from the electrode layers.

Referring to FIG. 2, the first electrode layers 54 and 64 are arranged on the rear surface 40b at the bottom side of the first dielectric layer 41. The second electrode layers 55 and 65 are arranged between the first dielectric layer 41 and the second dielectric layer 42. The third electrode layers 56 and 66 are arranged between the second dielectric layer 42 and the third dielectric layer 43. The fourth electrode layers 57 and 67 are arranged at the top side of the third dielectric layer 43. A line electrode 48 is also provided on the die-attach surface 40a, which is at the top side of the third dielectric layer 43 and which is a third main surface. The line electrode 48 is used for connection between the fourth electrode layers 57 and 67.

The fourth electrode layer 57 is provided on the mounting board at a position opposed to the transmission-side surface acoustic wave filter chip 20A. The fourth electrode layer 67 is provided on the mounting board at a position opposed to the reception-side surface acoustic wave filter chip 30A. The first to fourth electrode layers 54 to 57 are provided at positions overlapped with the transmission-side surface acoustic wave filter chip 20A in plan view of the die-attach surface 40a or the rear surface 40b. The first to fourth electrode layers 64 to 67 are provided at positions overlapped with the reception-side surface acoustic wave filter chip 30A in plan view of the die-attach surface 40a or the rear surface 40b.

The first to fourth electrode layers 54 to 57 are connected to each other by a via electrode 50 provided in the first to third dielectric layers 41 to 43. The via electrode 50 includes first to third via electrodes 51 to 53. The first via electrode 51 passes through the first dielectric layer 41 defining a portion of the mounting board 40 to electrically connect the first electrode layer 54 to the second electrode layer 55. The second via electrode 52 passes through the second dielectric layer 42 defining a portion of the mounting board 40 to electrically connect the second electrode layer 55 to the third electrode layer 56. The third via electrode 53 passes through the third dielectric layer 43 defining a portion of the mounting board 40 to electrically connect the third electrode layer 56 to the fourth electrode layer 57. The via electrode 50 passes through the mounting board 40 to connect the first electrode layer 54 to the fourth electrode layer 57.

The first to fourth electrode layers 64 to 67 are connected to each other by a via electrode 60 provided in the first to third dielectric layers 41 to 43. The via electrode 60 includes first to third via electrodes 61 to 63. The first via electrode 61 passes through the first dielectric layer 41 defining a portion of the mounting board 40 to electrically connect the first electrode layer 64 to the second electrode layer 65. The second via electrode 62 passes through the second dielectric layer 42 defining a portion of the mounting board 40 to electrically connect the second electrode layer 65 to the third electrode layer 66. The third via electrode 63 passes through the third dielectric layer 43 defining a portion of the mounting board 40 to electrically connect the third electrode layer 66 to the fourth electrode layer 67. The via electrode 60 passes through the mounting board 40 to connect the first electrode layer 64 to the fourth electrode layer 67.

Each of the first to third dielectric layers 41 to 43 may be made of, for example, resin or ceramics such as alumina. In other words, the mounting board 40 may be a multilayer printed wiring board made of resin or a multilayer ceramic board.

The duplexer 1 includes piezoelectric substrates 20B and 30B. The piezoelectric substrate 20B includes a main surface 20s. In the duplexer 1, a portion excluding the inductors L2 to L4 of the transmission circuit 20 (a portion surrounded by an upper broken line in FIG. 1) is provided on the main surface 20s of the piezoelectric substrate 20B. The series-arm elastic wave resonators S1 to S4 and the parallel-arm elastic wave resonators P1 to P4 are provided on the main surface 20s of the piezoelectric substrate 20B. The piezoelectric substrate 20B defines "a first piezoelectric substrate." The main surface 20s defines "a first main surface."

The piezoelectric substrate 30B includes a main surface 30s. In the duplexer 1, the reception circuit 30 (a portion surrounded by a lower broken line in FIG. 1) is provided on the main surface 30s of the piezoelectric substrate 30B. The piezoelectric substrate 30B defines "a second piezoelectric substrate." The main surface 30s defines "a second main surface."

In addition, in the duplexer 1, the antenna terminal 11, the transmission-side signal terminal 12, the first and second reception-side signal terminals 13a and 13b, and the inductors L1 to L4 are provided on the mounting board 40. The first electrode layers 54 and 64 provided on the rear surface 40b of the mounting board 40 define multiple terminals. These multiple terminals include the antenna terminal 11, the transmission-side signal terminal 12, and the first and second reception-side signal terminals 13a and 13b illustrated in FIG. 1.

Figure 3:
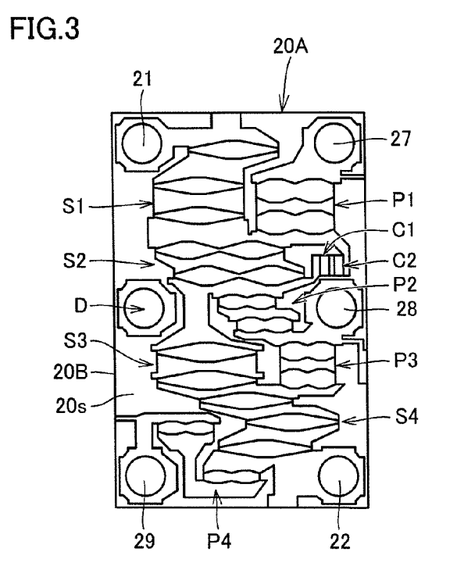
FIG. 3 is a schematic perspective plan view of a transmission-side surface acoustic wave filter chip in the demultiplexing apparatus of the first preferred embodiment of the present invention.

FIG. 3 is a schematic perspective plan view of the transmission-side surface acoustic wave filter chip 20A in the demultiplexing apparatus 100 of the first preferred embodiment. Specifically, the electrode configuration of the transmission-side surface acoustic wave filter chip 20A in a state in which the transmission-side surface acoustic wave filter chip 20A is viewed from above the demultiplexing apparatus 100 illustrated in FIG. 2 is illustrated in FIG. 3. A characteristic configuration of the demultiplexing apparatus 100 of the first preferred embodiment will be described with reference to FIG. 3 and FIGS. 4 to 8 described below.

As illustrated in FIG. 3, the transmission-side surface acoustic wave filter chip 20A includes the rectangular or substantially rectangular piezoelectric substrate 20B. The output terminal 21, the input terminal 22, the series-arm elastic wave resonators S1 to S4, the parallel-arm elastic wave resonators P1 to P4, the capacitors C1 and C2, the terminals 27 to 29 for connection to the ground potential, and a dummy pad D are provided on the main surface 20s of the piezoelectric substrate 20B. The bumps 70 illustrated in FIG. 2 are arranged at positions corresponding to the output terminal 21, the input terminal 22, the terminals 27 to 29, and the dummy pad D. The bumps 70 are used to electrically connect the output terminal 21, the input terminal 22, the terminals 27 to 29, and the dummy pad D to the fourth electrode layer 57.

The surface acoustic wave resonator defining each of the series-arm elastic wave resonators S1 to S4 and the parallel-arm elastic wave resonators P1 to P3 includes one interdigital transducer (IDT) electrode provided on the piezoelectric substrate 20B and a pair of reflectors arranged on both sides of the IDT electrode in the propagation direction of the surface acoustic waves. In other words, the surface acoustic wave resonator defining each of the series-arm elastic wave resonators S1 to S4 and the parallel-arm elastic wave resonators P1 to P4 is a one-port type surface acoustic wave resonator. Each of the capacitors C1 and C2 includes two pairs of comb shaped electrodes. The dummy pad D is electrically independent. The sealing member 80 made of resin is provided on the die-attach surface 40a of the mounting board 40 so as to have a hollow space enabling excitation of the IDT electrode provided on the piezoelectric substrate.

Figure 4:
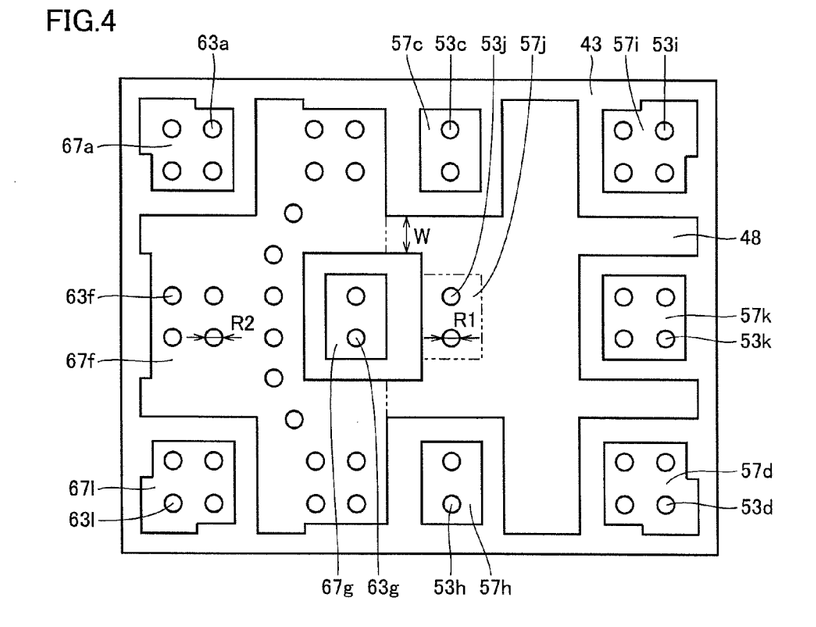
FIG. 4 is a schematic perspective plan view of fourth electrode layers and a third dielectric layer of a mounting board in the demultiplexing apparatus of the first preferred embodiment of the present invention.
Figure 5:
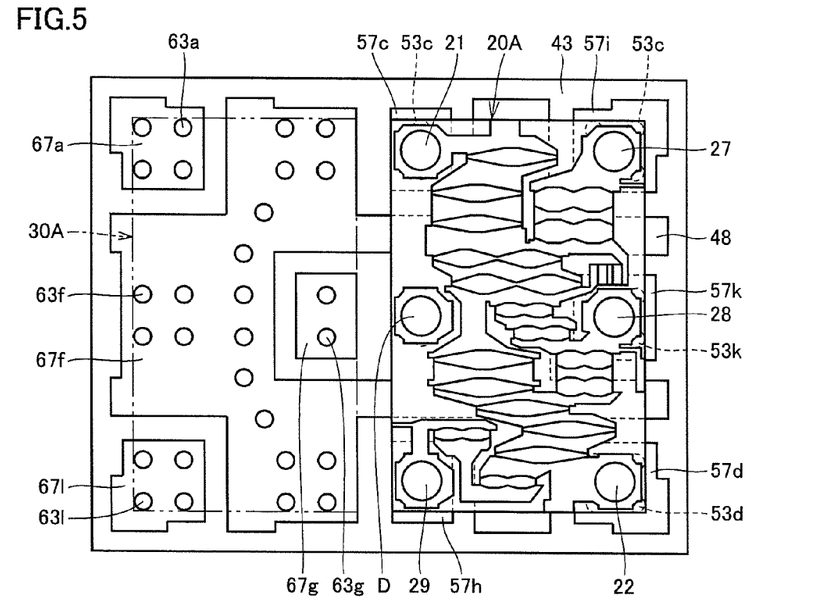
FIG. 5 is a schematic plan view of a die-attach surface of the mounting board in the demultiplexing apparatus of the first preferred embodiment of the present invention.
Figure 6:
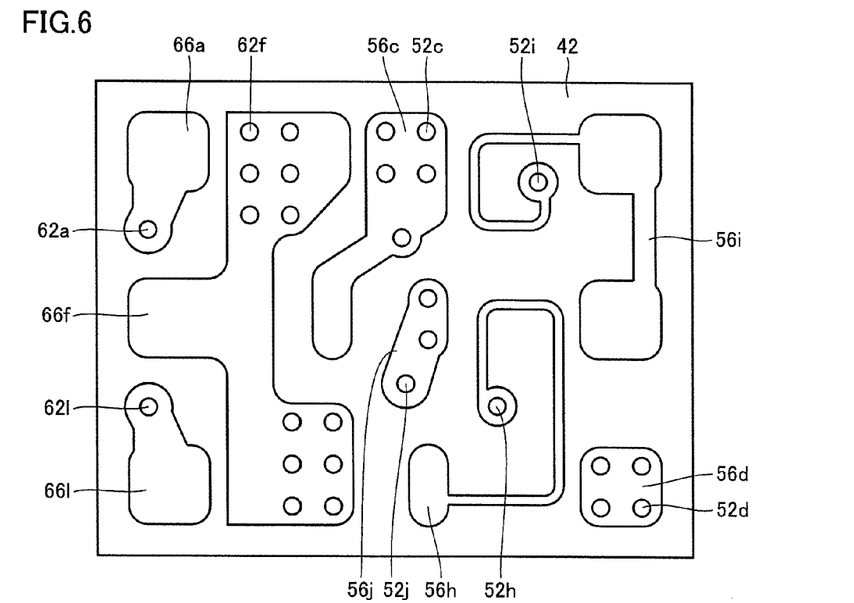
FIG. 6 is a schematic perspective plan view of third electrode layers and a second dielectric layer of the mounting board in the demultiplexing apparatus of the first preferred embodiment of the present invention.
Figure 7:
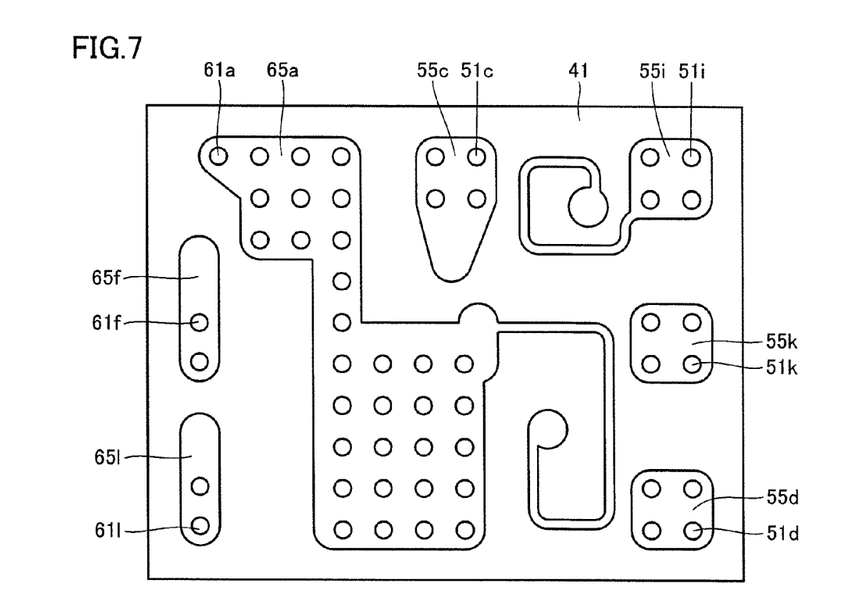
FIG. 7 is a schematic perspective plan view of second electrode layers and a first dielectric layer of the mounting board in the demultiplexing apparatus of the first preferred embodiment of the present invention.
Figure 8:
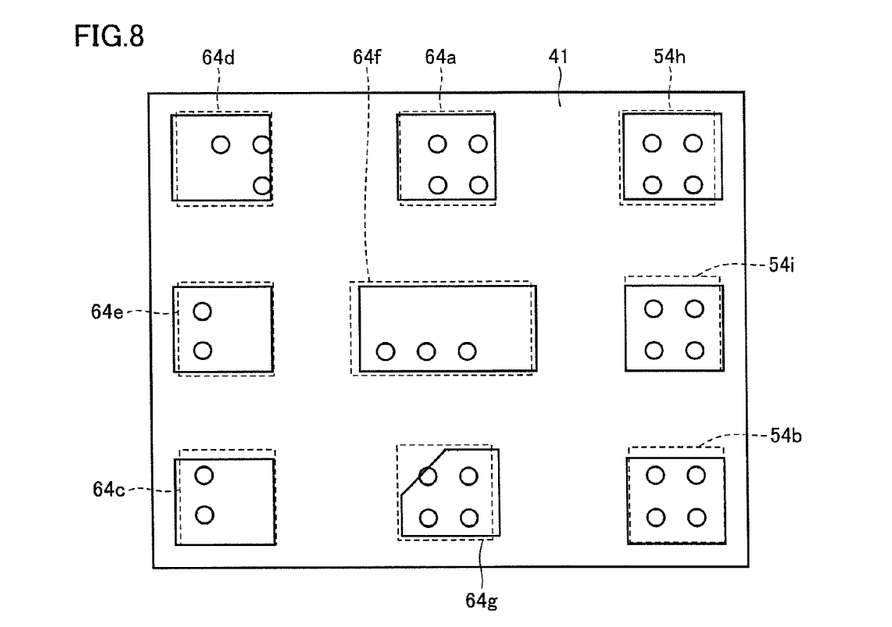
FIG. 8 is a schematic perspective plan view of first electrode layers of the mounting board in the demultiplexing apparatus of the first preferred embodiment of the present invention.

FIG. 4 is a schematic perspective plan view of the fourth electrode layers 57 and 67 and the third dielectric layer 43 of the mounting board 40 in the demultiplexing apparatus 100 of the first preferred embodiment. FIG. 5 is a schematic plan view of the die-attach surface 40a of the mounting board 40 in the demultiplexing apparatus 100 of the first preferred embodiment. FIG. 6 is a schematic perspective plan view of the third electrode layers 56 and 66 and the second dielectric layer 42 of the mounting board 40 in the demultiplexing apparatus 100 of the first preferred embodiment. FIG. 7 is a schematic perspective plan view of the second electrode layers 55 and 65 and the first dielectric layer 41 of the mounting board 40 in the demultiplexing apparatus 100 of the first preferred embodiment. FIG. 8 is a schematic perspective plan view of the first electrode layers 54 and 64 of the mounting board 40 in the demultiplexing apparatus 100 of the first preferred embodiment. FIGS. 4 to 8 illustrate a state in which the mounting board 40 is viewed from the side on which the transmission-side surface acoustic wave filter chip 20A and the reception-side surface acoustic wave filter chip 30A are mounted.

As illustrated in FIG. 4, the fourth electrode layer includes land electrodes 57c, 57d, 57h, 57i, 57j, and 57k. The fourth electrode layer 67 includes land electrodes 67a, 67f, 67g, and 67l. The fourth electrode layers 57 and 67 are land electrode layers. The land electrodes 57c, 57d, 57h, 57i, 57j, and 57k connected to the transmission-side surface acoustic wave filter chip 20A are provided on the die-attach surface 40a of the mounting board 40. The land electrodes 67a, 67f, 67g, and 67l connected to the reception-side surface acoustic wave filter chip 30A are provided on the die-attach surface 40a of the mounting board 40. The land electrode 57j at the transmission circuit 20 side is connected to the land electrode 67f at the reception circuit 30 side with the line electrode 48.

As illustrated in FIG. 5, the transmission-side surface acoustic wave filter chip 20A described above with reference to FIG. 3 and the reception-side surface acoustic wave filter chip 30A illustrated by an alternate long and two short dashes line in FIG. 5 are flip-chip mounted on the die-attach surface 40a. The respective terminals of the transmission-side surface acoustic wave filter chip 20A and the dummy pad D are connected to the land electrodes 57c, 57d, 57h, 57i, 57j, and 57k via the bumps 70. The respective terminals of the reception-side surface acoustic wave filter chip 30A are connected to the land electrodes 67a, 67f, 67g, and 67l via the bumps 70.

As illustrated in FIG. 6, the third electrode layers 56 and 66 are defined by electrodes 56c, 56d, 56h, 56i, 56j, 66a, 66f, and 66l. As illustrated in FIG. 7, the second electrode layers 55 and 65 are defined by electrodes 55c, 55d, 55i, 55k, 65a, 65f, and 65l. As illustrated in FIG. 8, the first electrode layers 54 and 64 are defined by electrodes 54b, 54h, 54i, 64a, 64c, 64d, 64e, 64f, and 64g. The first electrode layers 54 and 64 are provided on the rear surface 40b of the mounting board 40. The first electrode layers 54 and 64 are rear surface terminal layers. The land electrodes provided on the die-attach surface 40a of the mounting board 40 are connected to the rear surface terminal layers via the electrodes provided in the mounting board 40.

The electrode 64a of the first electrode layers 54 and 64 has a function as the antenna terminal 11. The electrode 64a is connected to the electrode 55c of the second electrode layers 55 and 65 by via electrodes 51c of the first dielectric layer 41. The electrode 55c is connected to the electrode 56c of the third electrode layers 56 and 66 by via electrodes 52c of the second dielectric layer 42. The electrode 56c is connected to the land electrode 57c of the fourth electrode layer 57 by via electrodes 53c of the third dielectric layer 43 and is connected to the land electrode 67g of the fourth electrode layer 67 by via electrodes 63g of the third dielectric layer 43. The land electrode 57c is connected to the output terminal 21 of the transmission-side surface acoustic wave filter chip 20A via the bump 70. The land electrode 67g is connected to the unbalanced input terminal 31 of the reception-side surface acoustic wave filter chip 30A via the bump 70.

The electrode 54b of the first electrode layer 54 has a function as the transmission-side signal terminal 12. The electrode 54b is connected to the electrode 55d of the second electrode layer 55 by via electrodes 51d of the first dielectric layer 41. The electrode 55d is connected to the electrode 56d of the third electrode layer 56 by via electrodes 52d of the second dielectric layer 42. The electrode 56d is connected to the land electrode 57d of the fourth electrode layer 57 by via electrodes 53d of the third dielectric layer 43. The land electrode 57d is connected to the input terminal 22 of the transmission-side surface acoustic wave filter chip 20A via the bump 70.

The electrode 64c of the first electrode layer 64 has a function as the first reception-side signal terminal 13a. The electrode 64c is connected to the electrode 65l of the second electrode layer 65 by via electrodes 61l of the first dielectric layer 41. The electrode 65l is connected to the electrode 66l of the third electrode layer 66 by a via electrode 62l of the second dielectric layer 42. The electrode 66l is connected to the land electrode 67l of the fourth electrode layer 67 by via electrodes 63l of the third dielectric layer 43. The land electrode 67l is connected to the first balanced output terminal 32a of the reception-side surface acoustic wave filter chip 30A via the bump 70.

The electrode 64e of the first electrode layer 64 has a function as the second reception-side signal terminal 13b. The electrode 64e is connected to the electrode 65f of the second electrode layer 65 by via electrodes 61f of the first dielectric layer 41. The electrode 65f is connected to the electrode 66a of the third electrode layer 66 by a via electrode 62a of the second dielectric layer 42. The electrode 66a is connected to the land electrode 67a of the fourth electrode layer 67 by via electrodes 63a of the third dielectric layer 43. The land electrode 67a is connected to the second balanced output terminal 32b of the reception-side surface acoustic wave filter chip 30A via the bump 70.

The electrodes 64d, 64f, and 64g of the first electrode layers 54 and 64 each have a function as a ground electrode. The electrodes 64d, 64f, and 64g are connected to the electrode 65a of the second electrode layer 65 by via electrodes 61a of the first dielectric layer 41. The electrode 65a is connected to the electrode 66f of the third electrode layer 66 by via electrodes 62f of the second dielectric layer 42, is connected to the electrode 56h of the third electrode layer 56 by a via electrode 52h of the second dielectric layer 42, and is connected to the electrode 56j of the third electrode layer 56 by via electrodes 52j of the second dielectric layer 42.

The electrode 66f is connected to the land electrode 67f of the fourth electrode layer 67 by via electrodes 63f of the third dielectric layer 43. The electrode 56h is connected to the land electrode 57h of the fourth electrode layer 57 by via electrodes 53h of the third dielectric layer 43. The electrode 56j is connected to the land electrode 57j of the fourth electrode layer 57 by via electrodes 53j of the third dielectric layer 43. The land electrode 67f is connected to a ground terminal of the reception-side surface acoustic wave filter chip 30A via the bump 70. The land electrode 57h is connected to the terminal 29 of the transmission-side surface acoustic wave filter chip 20A via the bump 70. The land electrode 57j is connected to the dummy pad D of the transmission-side surface acoustic wave filter chip 20A via the bump 70.

The electrode 54h of the first electrode layer 54 has a function as the ground electrode. The electrode 54h is connected to the electrode 55i of the second electrode layer 55 by via electrodes 51i of the first dielectric layer 41. The electrode 55i is connected to the electrode 56i of the third electrode layer 56 by a via electrode 52i of the second dielectric layer 42. The electrode 56i is connected to the land electrode 57i of the fourth electrode layer 57 by via electrodes 53i of the third dielectric layer 43 and is connected to the land electrode 57k of the fourth electrode layer 57 by via electrodes 53k of the third dielectric layer 43. The land electrode 57i is connected to the terminal 27 of the transmission-side surface acoustic wave filter chip 20A via the bump 70. The land electrode 57k is connected to the terminal 28 of the transmission-side surface acoustic wave filter chip 20A via the bump 70.

Although the electrode 54i of first electrode layer 54 is connected to the electrode 55k of the second electrode layer 55 by via electrodes 51k of the first dielectric layer 41, the electrode 54i is connected to no electrode of the third electrode layers 56 and 66 and the fourth electrode layers 57 and 67. Accordingly, the electrode 54i is a floating electrode.

The electrodes 55i and 56i, the land electrode 57i, and the via electrodes 51i, 52i, and 53i are inductor electrodes defining the inductor L2. The electrodes 55i and 56i, the land electrode 57k, and the via electrodes 51i, 52i, and 53k are inductor electrodes defining the inductor L3. The electrodes 65a and 56h, the land electrode 57h, and the via electrodes 61a, 52h, and 53h are inductor electrodes defining the inductor L4.

The die-attach surface 40a of the mounting board 40 defines "the third main surface." Among the land electrodes included in the fourth electrode layer 57, the land electrode 57j connected to the electrodes 64d, 64f, and 64g, which are the ground electrodes, via the via electrodes 50 and 60 defines a "first ground electrode." Among the land electrodes included in the fourth electrode layer 67, the land electrode 67f connected to the electrodes 64d, 64f, and 64g, which are the ground electrodes, via the via electrode 60 defines "a second ground electrode."

The first electrode layers 54 and 64 include the electrodes 64d, 64f, and 64g each having the function as the ground electrode. Among the electrodes 64d, 64f, and 64g, the electrode provided at a position overlapped with the transmission circuit 20 in plan view of the rear surface 40b of the mounting board 40 defines "a first rear surface ground electrode." Among the electrodes 64d, 64f, and 64g, the electrode provided at a position overlapped with the reception circuit 30 in plan view of the rear surface 40b of the mounting board 40 defines "a second rear surface ground electrode."

The via electrode 50 (the first to third via electrodes 51 to 53), which connects the land electrode 57j, which is the first ground electrode, to the first rear surface ground electrode, defines "a first via electrode." The first to third via electrodes 51 to 53 define "first electrode portions" included in the via electrode 50. The via electrode 60 (the first to third via electrodes 61 to 63), which connects the land electrode 67f, which is the second ground electrode, to the second rear surface ground electrode, defines "a second via electrode." The first to third via electrodes 61 to 63 define "second electrode portions" included in the via electrode 60.

In the demultiplexing apparatus 100 of the present preferred embodiment, as illustrated in FIG. 2, the line electrode 48 is provided on the die-attach surface 40a. As illustrated in FIG. 4, the line electrode 48 connects the land electrode 57j defining the first ground electrode to the land electrode 67f included in the second ground electrode. Alternate long and two short dashes lines illustrated in FIG. 4 indicate boundary lines between the land electrodes 57j and 67f and the line electrode 48. With reference to FIG. 4 and FIG. 5 for comparison, the line electrode 48 includes a portion provided at a position opposed to the transmission circuit 20.

In comparison between the number of electrodes defining a path to electrically connect the first ground electrode to the first rear surface ground electrode in the via electrode 50 and the number of electrodes defining a path to electrically connect the second ground electrode to the second rear surface ground electrode in the via electrode 60, the latter is larger than the former. Referring to FIG. 4, since the number of the via electrodes 53*j* in the third dielectric layer 43 is two and the number of the via electrodes 63*f* is 18, the quantity of the via electrodes 63*f* is greater than that of the via electrodes 53*j*. Referring to FIG. 6, since the number of the via electrodes 52*j* in the second dielectric layer 42 is three and the number of the via electrodes 62*f* is 12, the quantity of the via electrodes 62*f* is greater than that of the via electrodes 52*j*.

Accordingly, the projection area when the multiple via electrodes connecting the second ground electrode (the land electrode 67*f*) to the second rear surface ground electrode are projected on the die-attach surface 40*a* is greater than the projection area when the multiple via electrodes connecting the first ground electrode (the land electrode 57*j*) to the first rear surface ground electrode are projected on the die-attach surface 40*a*. As a result, the amount of heat transfer per unit time of the via electrodes connecting the second ground electrode to the second rear surface ground electrode is greater than the amount of heat transfer per unit time of the via electrodes connecting the first ground electrode to the first rear surface ground electrode.

A width W illustrated in FIG. 4 indicates a minimum width of the line electrode 48 in plan view of the die-attach surface 40*a* of the mounting board 40. A diameter R1 illustrated in FIG. 4 indicates a maximum diameter of an inscribed circle when the via electrodes 53*j* included in the first via electrode connecting the first ground electrode to the first rear surface ground electrode is projected on the die-attach surface 40*a*. A diameter R2 illustrated in FIG. 4 indicates a maximum diameter of an inscribed circle when the via electrodes 63*f* included in the second via electrode connecting the second ground electrode to the second rear surface ground electrode is projected on the die-attach surface 40*a*. Comparison between the width W and the diameters R1 and R2 indicates that the width W is greater than the diameter R1 and is greater than the diameter R2.

In the demultiplexing apparatus 100 having the above configuration, upon application of input voltage through the input terminal 22 of the transmission circuit 20, the transmission circuit 20 generates heat. In order to prevent an increase in temperature of the transmission circuit 20, it is necessary to dissipate the heat from the transmission circuit 20. However, it is difficult to increase the quantity of the via electrode 50, which is used as a heat dissipation path at the transmission circuit 20 side, because of a restriction resulting from the formation of the inductor circuit at the transmission circuit 20 side of the mounting board 40.

Accordingly, in the demultiplexing apparatus 100 of the first preferred embodiment, the land electrode 57*j* connected to the transmission circuit 20 at a side where the power load is relatively high is connected to the land electrode 67*f* connected to the reception circuit 30 at a side where the power load is relatively low with the line electrode 48. Consequently, heat transfer from the land electrode 57*j* to the land electrode 67*f* via the line electrode 48 is enabled. The heat generated in the transmission circuit 20 is transferred to the electrodes 64*d*, 64*f*, and 64*g* defining the rear surface terminal layer sequentially via the via electrodes 63*f*, 62*f*, 61*a* connected to the land electrode 67*f* at the reception circuit 30 side where the power load is low and is dissipated from the rear surface 40*b*. In this case, the line electrode 48 is included in the hollow space.

The formation of the transfer path of the heat generated in the transmission circuit 20 at the reception circuit 30 side allows the heat to be dissipated from the transmission circuit 20 via the bumps 70 and the first to fourth electrode layers 54 to 57 and 64 to 67 and the via electrodes 50 and 60 provided in the mounting board 40. As a result, the heat dissipation performance of the transmission circuit 20 is improved to realize the demultiplexing apparatus 100 having the improved heat dissipation performance. Accordingly, the increase in temperature of the transmission circuit 20 is suppressed to improve the electric power handling capability of the demultiplexing apparatus 100.

As the result of the projection area of the second via electrode on the die-attach surface 40*a*, which is made greater than the projection area of the first via electrode on the die-attach surface 40*a*, the amount of heat transfer per unit time of the second via electrode is greater than that of the first via electrode. Accordingly, adopting the configuration in which the heat of the transmission circuit 20 is dissipated via the second via electrode allows the heat dissipation performance of the transmission circuit 20 to be further improved. Since the formation of the line electrode 48 at a position opposed to the transmission circuit 20 facilitates the heat transfer from the transmission circuit 20 to the line electrode 48, it is possible to further improve the heat dissipation performance of the transmission circuit 20.

Connecting the first ground electrode (the land electrode 57*j*) to the second ground electrode (the land electrode 67*f*) with the line electrode 48, which is thicker than the via electrodes 53*c* included in the path from the first ground electrode to the first rear surface ground electrode, allows the heat dissipation from the transmission circuit 20 to the electrodes at the reception circuit 30 side to be further facilitated.

Directly connecting the line electrode 48 to the second ground electrode at the reception circuit 30 side and connecting the line electrode 48 to the multiple first to third via electrodes 61 to 63 via the second ground electrode allow the heat dissipation performance to the outside to be improved. In order to further increase the heat dissipation from the transmission circuit 20, it is desired to connect the transmission circuit 20 to the first ground electrode with the multiple bumps 70.

Thermal analysis simulation of the temperature of the surface of the transmission circuit 20 was performed for the demultiplexing apparatus 100 of the first preferred embodiment and a demultiplexing apparatus of a comparative example. The demultiplexing apparatus of the comparative example was set to have a configuration in which the line electrode 48 is excluded from the demultiplexing apparatus 100 of the first preferred embodiment described above and the first ground electrode at the transmission circuit 20 side is not connected to the second ground electrode at the reception circuit 30 side. As a result of the analysis, the surface temperature of the transmission circuit 20 in the demultiplexing apparatus of the comparative example was 153° C. and the surface temperature of the transmission circuit 20 in the demultiplexing apparatus 100 of the first preferred embodiment was 144° C., for example. The result of the simulation indicated that the demultiplexing apparatus 100 of the first preferred embodiment has heat dissipation performance higher than that of the demultiplexing apparatus of the comparative example and the temperature of the transmission circuit 20 in a state in which the power is applied of the demultiplexing apparatus 100 of the first preferred embodiment is lower that of the demultiplexing apparatus of the comparative example. Accordingly, the demultiplexing apparatus 100 of the first preferred embodiment achieved excellent electric power handling capability, compared with the demultiplexing apparatus of the comparative example.

Second Preferred Embodiment

Figure 9:
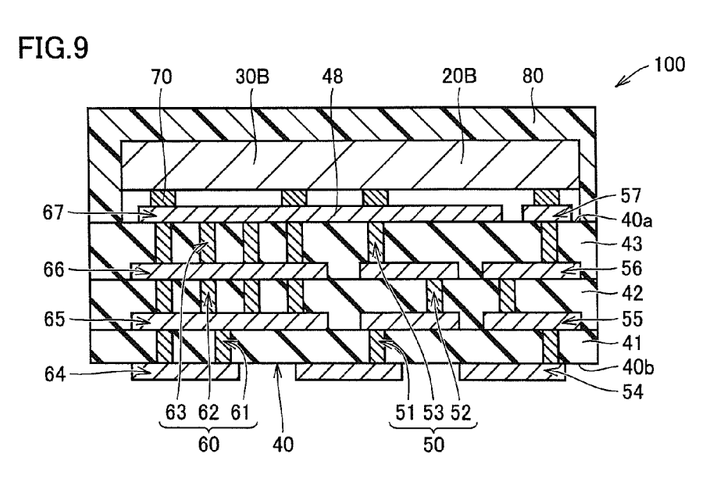
FIG. 9 is a schematic cross-sectional view of a demultiplexing apparatus of a second preferred embodiment of the present invention.

FIG. 9 is a schematic cross-sectional view of a demultiplexing apparatus 100 of a second preferred embodiment of the present invention. The demultiplexing apparatus 100 of the second preferred embodiment differs from the first preferred embodiment in that the same piezoelectric substrate is used as the piezoelectric substrate 20B on which the transmission circuit 20 is provided and the piezoelectric substrate 30B on which the reception circuit 30 is provided. As illustrated in FIG. 9, the demultiplexing apparatus 100 of the second preferred embodiment is configured such that a portion of the second via electrode at the reception circuit 30 side passes through all the dielectric layers of the mounting board and the electrodes in the portion of the second via electrode are overlaid on each other in plan view of the first main surface of the mounting board. Decreasing the distance of the second via electrode by adopting such a configuration allows the heat dissipation performance to be improved.

Even in a case in which the demultiplexing apparatus 100 has a one-chip configuration in which one substrate is used as the piezoelectric substrates 20B and 30B, connecting the first ground electrode connected to the transmission circuit 20 to the second ground electrode connected to the reception circuit 30 with the line electrode 48 similarly achieves the advantages of the improvement of the heat dissipation performance of the transmission circuit 20 and the improvement of the electric power handling capability of the demultiplexing apparatus 100.

Third Preferred Embodiment

Figure 10:
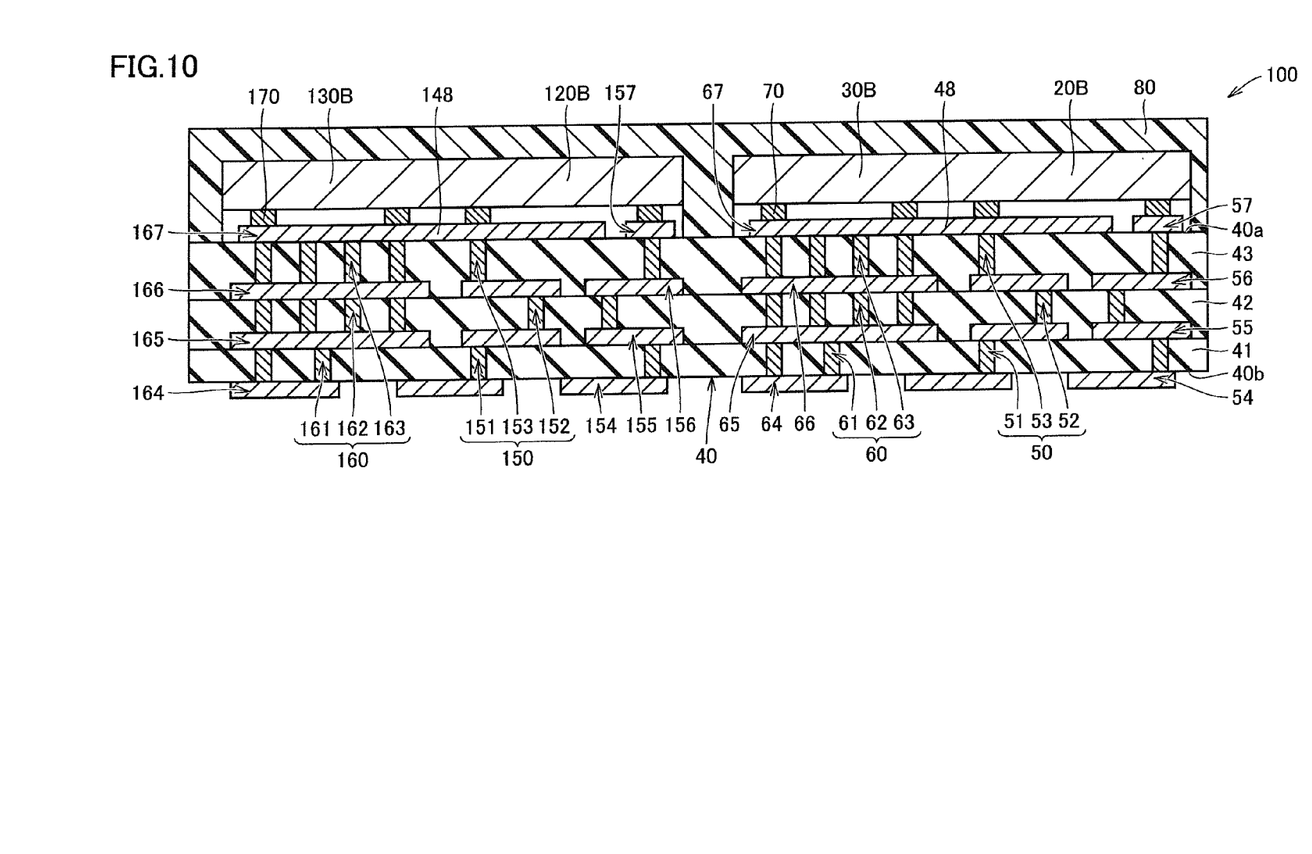
FIG. 10 is a schematic cross-sectional view of a demultiplexing apparatus of a third preferred embodiment of the present invention.

FIG. 10 is a schematic cross-sectional view of a demultiplexing apparatus 100 of a third preferred embodiment of the present invention. The demultiplexing apparatus 100 of the third preferred embodiment differs from the second preferred embodiment in that multiple transmission circuits and multiple reception circuits are mounted on the mounting board 40.

Specifically, as illustrated in FIG. 10, a piezoelectric substrate commonly used as the piezoelectric substrates 20B and 30B described above in the second preferred embodiment and another piezoelectric substrate are mounted next to each other on the die-attach surface 40a of the mounting board 40. In the other piezoelectric substrate, the same piezoelectric substrate is used as a piezoelectric substrate 120B on which the transmission circuit is provided and a piezoelectric substrate 130B on which the reception circuit is provided. The other piezoelectric substrate is flip-chip mounted on the die-attach surface 40a with bumps 170. First to fourth electrode layers 154 to 157 and 164 to 167 and via electrodes 150 and 160 are provided in the mounting board 40. The via electrode 150 includes first to third via electrodes 151 to 153. The via electrode 160 includes first to third via electrodes 161 to 163.

The transmission circuit 20 provided on the piezoelectric substrate 20B conforms to a first communication standard. The transmission circuit provided on the piezoelectric substrate 120B conforms to a second communication standard different from the first communication standard and defines "a second transmission circuit." The mounting board 40 further includes the electrode layer 157 on the die-attach surface 40a, which is provided at a position opposed to the second transmission circuit; the fourth electrode layer 167 on the die-attach surface 40a, which is provided at a position opposed to the reception circuit provided on the piezoelectric substrate 130B; and a line electrode 148 that is provided on the die-attach surface 40a and that is used for connection between the fourth electrode layer 157 and the fourth electrode layer 167. The ground electrode included in the fourth electrode layer 157 defines "a third ground electrode."

In the demultiplexing apparatus 100 of the third preferred embodiment having the above configuration, the first ground electrode connected to the transmission circuit 20 is connected to the second ground electrode connected to the reception circuit 30 with the line electrode 48. In addition, the third ground electrode connected to the transmission circuit provided on the piezoelectric substrate 120B is connected to the ground electrode connected to the reception circuit provided on the piezoelectric substrate 130B with the line electrode 148. Accordingly, the advantages of the improvement of the heat dissipation performance of the transmission circuit and the improvement of the electric power handling capability of the demultiplexing apparatus 100 are similarly achieved.

Fourth Preferred Embodiment

Figure 11:
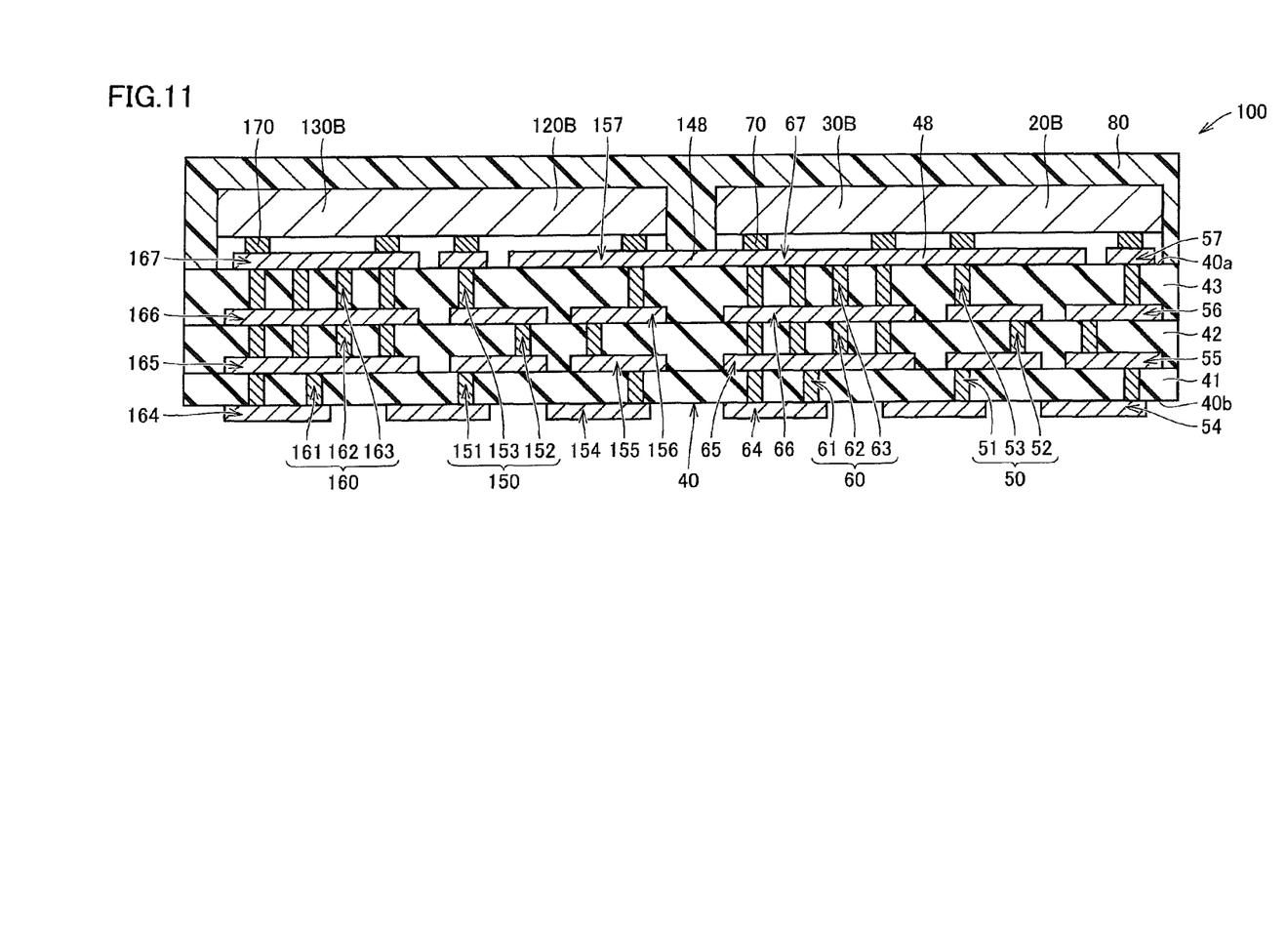
FIG. 11 is a schematic cross-sectional view of a demultiplexing apparatus of a fourth preferred embodiment of the present invention.

FIG. 11 is a schematic cross-sectional view of a demultiplexing apparatus 100 of a fourth preferred embodiment of the present invention. The demultiplexing apparatus 100 of the fourth preferred embodiment differs from the third preferred embodiment in the configuration of the line electrode 148 provided on the die-attach surface 40a.

Specifically, the line electrode 148 connects the ground electrode included in the fourth electrode layer 157 to the ground electrode included in the fourth electrode layer 67. The demultiplexing apparatus 100 of the fourth preferred embodiment includes the line electrode 148, which connects the second ground electrode connected to the reception circuit 30 to the third ground electrode connected to the transmission circuit provided on the piezoelectric substrate 120B. The line electrode 148 defines "a second line electrode."

In the demultiplexing apparatus 100 of the fourth preferred embodiment having the above configuration, the heat generated in the transmission circuit provided on the piezoelectric substrate 120B is capable of being transferred to the ground electrode at the reception circuit 30 side via the line electrode 148. Accordingly, the advantages of the improvement of the heat dissipation performance of the transmission circuit and the improvement of the electric power handling capability of the demultiplexing apparatus 100 are similarly achieved.

The CSP type duplexer 1 is described above, in which the transmission-side surface acoustic wave filter chip 20A and the reception-side surface acoustic wave filter chip 30A are flip-chip mounted on the die-attach surface 40a of the mounting board 40 and are covered with the sealing member 80 so as to provide the hollow space. The demultiplexing apparatus 100 according to a preferred embodiment of the present invention is not limited to this configuration. For example, a bare chip type surface acoustic wave filter chip preferably is manufactured by forming surface acoustic wave elements on a piezoelectric substrate in a wafer state and separating the piezoelectric substrate into individual chips. Then, the bare chip type surface acoustic wave filter chip including the transmission circuit and the reception circuit is mounted on the mounting board 40 so that a surface of the piezoelectric substrate on which the surface acoustic wave elements are formed is opposed to the mounting board 40. Then, the sealing member 80 is provided on the mounting board 40 so that the bare chip type surface acoustic wave filter chip including the transmission circuit and the reception circuit are covered with the sealing member 80 so as to provide the hollow space having the surface acoustic wave elements exposed therein. The demultiplexing apparatus may have such a configuration including the bare chip type surface acoustic wave filter chip.

Figure 12:
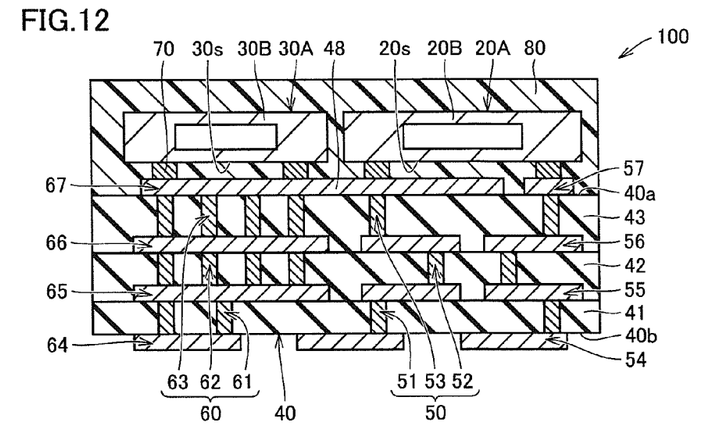
FIG. 12 is a schematic cross-sectional view of a demultiplexing apparatus in which a WLP type surface acoustic wave filter chip is mounted in a modification of a preferred embodiment of the present invention.

As another configuration, surface acoustic wave elements are provided on a piezoelectric substrate in a wafer state. A wafer level package (WLP) type surface acoustic wave filter chip is manufactured by forming the hollow space with a supporting member having an opening surrounding the surface acoustic wave elements and a cover member blocking the opening and separating the piezoelectric substrate into individual pieces. After the WLP type surface acoustic wave filter chip is mounted on the mounting board 40, the sealing member 80 is provided on the mounting board 40 so that the WLP type surface acoustic wave filter chip is covered with the sealing member 80. At this time, the hollow space may not be necessarily provided between the WLP type surface acoustic wave filter chip and the mounting board 40. The demultiplexing apparatus may have a configuration illustrated in FIG. 12, which includes such a WLP type surface acoustic wave filter chip. Alternatively, a module component in which a switch integrated circuit (IC) or a power amplifier is mounted on the multilayer mounting board 40, in addition to the surface acoustic wave filter chip, may be used.

Figure 13:
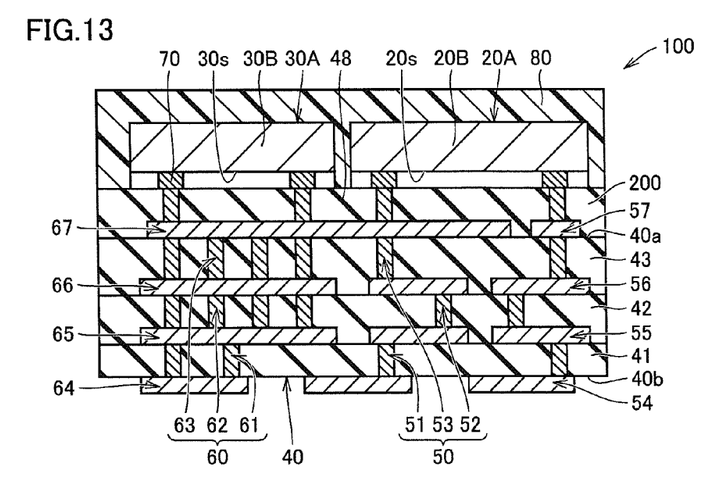
FIG. 13 is a first schematic cross-sectional view of a demultiplexing apparatus including a resist layer located on a die-attach surface in a modification of a preferred embodiment of the present invention.
Figure 14:
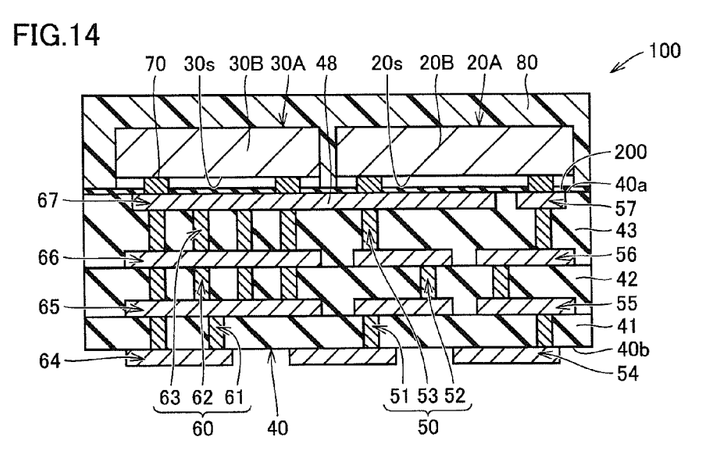
FIG. 14 is a second schematic cross-sectional view of a demultiplexing apparatus including a resist layer on the die-attach surface in a modification of a preferred embodiment of the present invention.

In order to prevent the die-attach surface of the mounting board from short-circuiting, a resist layer 200 made of an insulating material may be provided on the die-attach surface, as illustrated in FIGS. 13 and 14, so that at least portion of the land electrodes are exposed from the resist layer 200 and the remaining portion is covered with the resist layer 200. For example, resin or ceramics may be used as the material of the resist layer 200. In this case, as illustrated in FIG. 13, the resist layer 200 made of the same material as that of the dielectric layers of the mounting board may be used.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A demultiplexing apparatus comprising:
   an elastic wave filter; and
   a mounting board on which the elastic wave filter is mounted and which has a multilayer structure; wherein
   the elastic wave filter includes:
     a first piezoelectric substrate including a first main surface;
     a ladder transmission circuit that is provided on the first main surface and that includes a series-arm elastic wave resonator and a parallel-arm elastic wave resonator;
     a second piezoelectric substrate including a second main surface; and
     a longitudinally coupled resonator reception circuit provided on the second main surface;
   the mounting board includes:
     a third main surface;
     a rear surface opposite to the third main surface;
     a first ground electrode on the third main surface, which is provided at a position overlapped with the transmission circuit in plan view of the third main surface;
     a first rear surface ground electrode on the rear surface, which is provided at a position overlapped with the transmission circuit in plan view of the rear surface;
     a second ground electrode on the third main surface, which is provided at a position overlapped with the reception circuit in plan view of the third main surface;
     a second rear surface ground electrode on the rear surface, which is provided at a position overlapped with the reception circuit in plan view of the rear surface;
     a line electrode that is provided on the third main surface and that provides connection between the first ground electrode and the second ground electrode;
     a first via electrode that is provided in the mounting board and that provides connection between the first ground electrode and the first rear surface ground electrode; and
     a second via electrode that is provided in the mounting board and that is provides connection between the second ground electrode and the second rear surface ground electrode; and
   an amount of heat transfer per unit time of the second via electrode is greater than an amount of heat transfer per unit time of the first via electrode.

2. The demultiplexing apparatus according to claim 1, wherein the line electrode is provided at a position opposed to the transmission circuit.

3. The demultiplexing apparatus according to claim 1, wherein a projection area of the second via electrode on the third main surface is greater than a projection area of the first via electrode on the third main surface.

4. The demultiplexing apparatus according to claim 3, wherein a quantity of the second via electrode is greater than a quantity of the first via electrode.

5. The demultiplexing apparatus according to claim 1, wherein a same piezoelectric substrate defines the first piezoelectric substrate and the second piezoelectric substrate.

6. The demultiplexing apparatus according to claim 1, wherein
   the transmission circuit conforms to a first communication standard;
   the elastic wave filter further includes a second transmission circuit conforming to a second communication standard different from the first communication standard; and
   the mounting board further includes a third ground electrode on the third main surface, which is provided at a position opposed to the second transmission circuit, and a second line electrode that is provided on the third main surface and that provides connection between the third ground electrode and the second ground electrode.

7. The demultiplexing apparatus according to claim 1, wherein
   the first via electrode includes a plurality of first electrode portions passing through at least a portion of the mounting board;

the second via electrode includes a plurality of second electrode portions passing through at least a portion of the mounting board; and a minimum width of the line electrode in plan view of the third main surface is greater than a maximum diameter of an inscribed circle when the first electrode portions are projected on the third main surface and is greater than a maximum diameter of an inscribed circle when the second electrode portions are projected on the third main surface.

8. The demultiplexing apparatus according to claim 1, further comprising:

a sealing member provided on the third main surface so that the elastic wave filter is covered with the sealing member.

9. The demultiplexing apparatus according to claim 1, wherein the mounting board is a laminated substrate including electrode layers and dielectric layers alternatingly arranged; and the second via electrode includes a plurality of second electrode portions passing through all of the dielectric layers.

10. The demultiplexing apparatus according to claim 1, wherein the elastic wave filter defines a duplexer.

11. The demultiplexing apparatus according to claim 1, wherein each of the series-arm elastic wave resonator and the parallel-arm elastic wave resonator of the ladder transmission circuit includes a surface acoustic wave resonator.

12. The demultiplexing apparatus according to claim 1, wherein the longitudinally coupled resonator reception circuit includes a surface acoustic wave resonator and a longitudinally coupled resonator surface acoustic wave filter.

13. The demultiplexing apparatus according to claim 1, wherein the elastic wave filter includes a transmission-side surface acoustic wave filter chip and a reception-side surface acoustic wave filter chip.

14. The demultiplexing apparatus according to claim 1, wherein the elastic wave filter is a chip size package surface acoustic wave filter apparatus.

15. The demultiplexing apparatus according to claim 1, further comprising an antenna terminal, a transmission side terminal, first and second reception-side terminals, and inductors are mounted on the mounting board.

16. The demultiplexing apparatus according to claim 1, wherein the third main surface is a die-attach surface.

17. The demultiplexing apparatus according to claim 1, wherein a plurality of transmission circuits and a plurality of reception circuits are mounted on the mounting board.

* * * * *